United States Patent [19]
Viza et al.

[11] Patent Number: 5,848,466
[45] Date of Patent: Dec. 15, 1998

[54] METHOD FOR FORMING A MICROELECTRONIC ASSEMBLY

[75] Inventors: Daniel Joseph Viza, Phoenix, Ariz.; Dennis Brian Miller, Barrington, Ill.; William M. Beckenbaugh, Scottsdale, Ariz.; Conrad S. Monroe, Forstinning, Germany; Kent W. Hansen, Scottsdale, Ariz.

[73] Assignee: Motorola, Inc., Schaumburg, Ill.

[21] Appl. No.: 752,019

[22] Filed: Nov. 19, 1996

[51] Int. Cl.⁶ ...................................... H05K 3/34
[52] U.S. Cl. .............. 29/840; 29/852; 156/243; 228/180.22
[58] Field of Search ............... 29/827, 840, 852; 156/243; 228/180.22

[56] References Cited

U.S. PATENT DOCUMENTS

| | | |
|---|---|---|
| 5,262,226 | 11/1993 | Yoshida . |
| 5,384,952 | 1/1995 | Matsui . |
| 5,434,452 | 7/1995 | Higgins, III . |
| 5,681,647 | 10/1997 | Caillat . |

FOREIGN PATENT DOCUMENTS 55-46572   4/1980   Japan .

Primary Examiner—Carl J. Arbes
Attorney, Agent, or Firm—Douglas D. Fekete; John MacIntyre

[57] ABSTRACT

A microelectronic assembly (10) is formed by bonding an integrated circuit component (20) to a substrate (12). The substrate (12) includes a via (22) and a metal contact (24) closing the via (22). A bonding agent (14), such as a solder paste or a conductive epoxy, is dispensed into the via (22) adjacent the metal contact (24). A carrier tape (16) that includes partially-cured films (18) is placed onto the substrate (12) such that the film (18) covers the via (22) and forms a gap (28) between the substrate (12) and the film (18). The integrated circuit component (20) is superposed onto the substrate (12) such that conductive bumps (26) on the integrated circuit component (20) perforate and extend through the film (18) and contact the bonding agent (14) in the via (22). Portions (44) displaced during perforation are received in the gap (28). The film (18) is thus interposed between the substrate (12) and the integrated circuit component (20). The preassembly (38) is then heated to bond the bonding agent (14) to the metal contact (24) and to cure the film (18) to form an integral assembly (10).

18 Claims, 1 Drawing Sheet ns. 5,848,466

METHOD FOR FORMING A MICROELECTRONIC ASSEMBLY

FIELD OF THE INVENTION

This invention relates generally to a method for forming a microelectronic assembly that includes an integrated circuit component having conductive bumps, a substrate having vias containing a bonding agent, and a film interposed therebetween. More particularly, this invention relates to such an assembly wherein a film and an integrated circuit component are placed onto the substrate such that conductive bumps on the integrated circuit component perforate the film and extend into a via in the substrate and contact a bonding agent that is disposed within the via.

BACKGROUND OF THE INVENTION

It is known to form a microelectronic assembly by mounting an integrated circuit component onto a substrate. To enhance the reliability of the assembly, an encapsulant is disposed between the component and the substrate. This is typically accomplished by dispensing a liquid containing a curable polymeric material between the integrated circuit component and the substrate. This typically happens after the component has been mounted to the substrate. The prepolymer liquid is then cured, such as by heating, to form the encapsulant that strengthens the assembly and protects the solder bump interconnections from environmental damage.

It has been proposed to superpose an integrated circuit component over a substrate to connect conductive bumps on the component to bond pads on the substrate to form electrical interconnections. A liquid or partially-cured prepolymer is disposed on the substrate, and a component is placed over the film to form a preassembly. The preassembly is then heated to bond the conductive bumps to the bond pads and to concurrently cure the prepolymer. However, a reliable connection has not been formed when using a partially-cured film due to the resistance given by the film and the conductive material disposed in the substrate to the conductive bumps. Consequently, reliable connections have been difficult to achieve.

Therefore, a need exists for a method of forming a reliable, completely underfilled microelectronic assembly that is able to be reinforced with a polymeric encapsulant without the additional process of underfilling subsequent to attachment of the component to the substrate.

DETAILED DESCRIPTION OF A PREFERRED EMBODIMENT

The present invention provides a microelectronic assembly formed by an integrated circuit component bonded to a substrate. The substrate includes a via and a metal contact overlying the via. The via contains a bonding agent that may suitably be a solder paste or a conductive epoxy. A film formed of a partially-cured prepolymer is placed onto the substrate such that the film covers the via. The integrated circuit component is superposed onto the substrate to form a preassembly such that conductive bumps on the integrated circuit component perforate the film and extend into the via into contact with the bonding agent. The film is thus interposed between the substrate and the integrated circuit component. In accordance with this invention, a gap is provided for clearance for material of the film displaced during perforation. The preassembly is then heated to bond the bonding agent to the conductive bumps and to concurrently cure the film to form a layer that bonds the integrated circuit component to the substrate to form an integral assembly.

Figure 1:
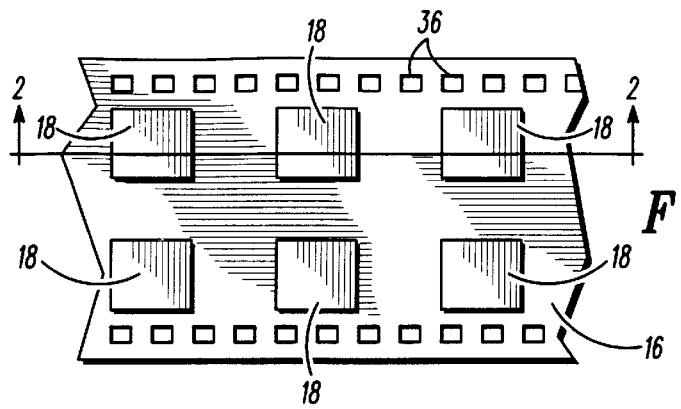
FIG. 1 is a bottom plan view of a carrier tape that includes a film in accordance with a preferred embodiment of the present invention.
Figure 2:
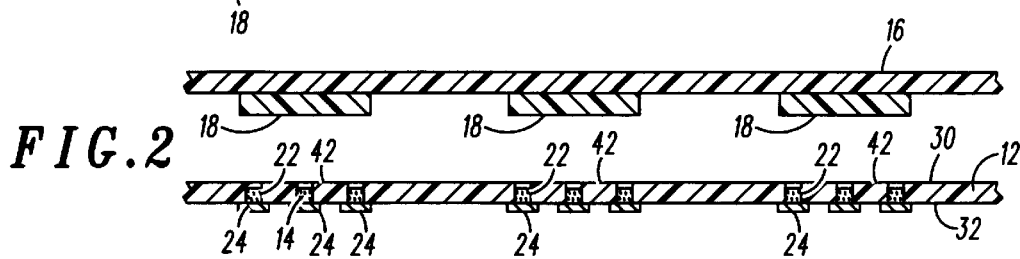
FIG. 2 is a cross-sectional view of the carrier tape of FIG. 1 taken along line 2—2 superposed over a substrate in accordance with a preferred embodiment of the present invention.
Figure 3:
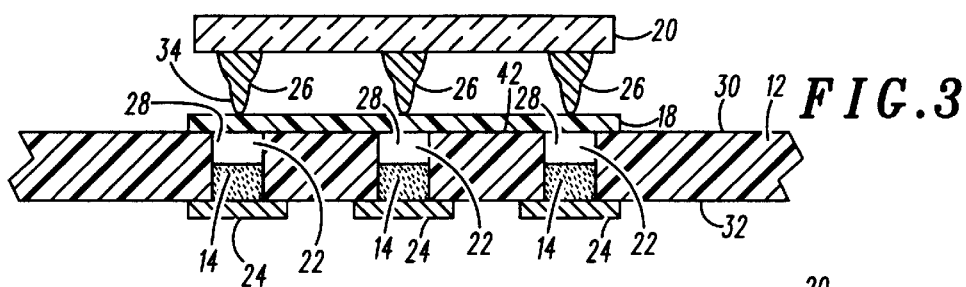
FIG. 3 is a cross-sectional view of an arrangement of an integrated circuit component superposed over the film in preparation for assembly to form an assembly in accordance with a preferred embodiment of the present invention.

A preferred embodiment of the present invention can be better understood with reference to FIGS. 1–5. In accordance with a preferred embodiment of this invention, FIG. 1 depicts a carrier tape 16 that includes a plurality of films 18. Carrier tape 16 is preferably a quick-release tape formed of a polymeric material or a coated paper. Films 18 are mounted onto tape 16 and are preferably formed of a thermoset resin that is partially cured to a non-fully crosslinked stage. Film 18 is suitably a bis-A type epoxy resin that includes an anhydride hardener, such as methylhexahydrophthalic anhydride, and a latent accelerator. In a preferred embodiment, carrier tape 16 includes a plurality of films 18 that register with a plurality of vias in a corresponding substrate, as depicted in FIG. 2.

FIG. 2 depicts carrier tape 16 overlying substrate 12. Substrate 12 includes regions 42 subsequently severed to form a plurality of substrates. Substrate 12 is preferably a flexible substrate. Substrate 12 includes a plurality of vias 22 that extend through substrate 12 from a top face 30 to a bottom face 32 opposite top face 30. Each via 22 has an opening at top face 30. Each region 42 corresponds to a substrate in the product assembly and includes a set of vias. Substrate 12 further includes a plurality of metal contacts 24 remote from the openings that close a corresponding via 22 at bottom face 32 to allow via 22 to contain a liquid bonding agent disposed therein. Metal contacts 24, which are suitably copper bond pads, are effective to conduct electrical signals to and from substrate 12 for processing. Vias 22 are sized and shaped to receive a bonding agent liquid.

A bonding agent 14 is dispensed into via 22 adjacent metal contact 24. Bonding agent 14 is dispensed into vias 22 by screen printing, syringe dispensing, or the like. In a preferred embodiment, bonding agent 14 is a solder paste formed of solder particles dispersed in a liquid vehicle. Bonding agent 14 is alternately composed of a metal particulate filled prepolymeric material curable to form a conductive resin bond, such as a conductive epoxy resin. Bonding agent 14 comprises a vaporizable vehicle that vaporizes during bonding to reduce volume of bonding agent 14 within via 22. In this manner, vias 22 contain a predetermined bonding agent volume effective to bond with conductive bumps on an integrated circuit component that is mounted onto substrate 12. The predetermined bonding agent volume is less than the volume of via 22. In this manner, bonding agent 14 does not completely fill via 22, consequently forming a gap between bonding agent 14 and the open top of via 22.

Figure 4:
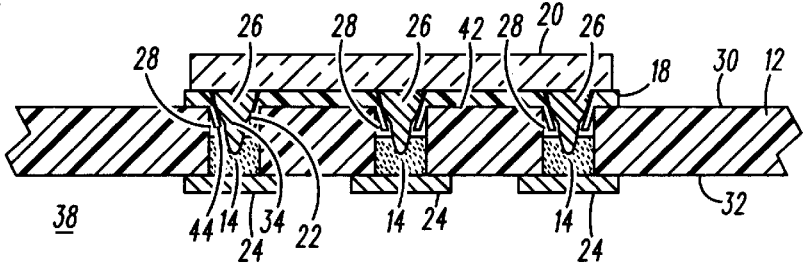
FIG. 4 is a cross-sectional view of a preassembly formed by the arrangement in FIG. 3.
Figure 5:
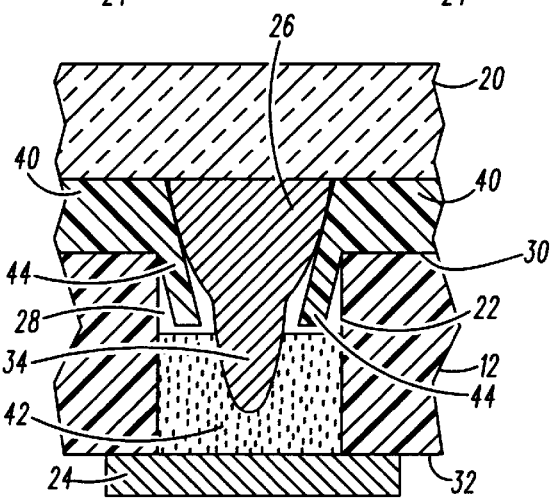
FIG. 5 is an enlarged view of a portion of FIG. 4 showing details of a bump extending into a via and perforating the film.

In a preferred embodiment, sprocket holes 36 align carrier tape 16 and substrate 12 to ensure proper placement of films 18. Films 18 are applied to substrate 12, and each film 18 covers a corresponding region 42, thereby covering a set of vias 22. A preferred method of applying films 18 is laminating films 18 to substrate 12 and peeling films 18 from carrier tape 16, and removing excess carrier tape 16 on a take-up reel. Gap 28 is formed within via 22 between bonding agent 14 and film 18. Gap 28 provides clearance for portions 44 of film 18 perforated by integrated circuit component 20, as depicted in FIGS. 4 and 5.

Integrated circuit component 20 is superposed onto substrate 12 to form preassembly 38. Integrated circuit component 20 is preferably an integrated circuit die that is mounted directly onto substrate 12 by a flip-chip process. Alternately, integrated circuit component 20 is a ball grid array package that includes an integrated circuit die mounted onto a carrier. Component 20 includes a plurality of conductive bumps 26, preferably formed of gold formed by a wire bonding process or of copper. Each conductive bump 26 has a tip 34 that facilitates the extension of bump 26 through film 18 to contact bonding agent 14. Component 20 is preferably superposed onto substrate 12 such that each conductive bump 26 registers with a corresponding via 22.

Preassembly 38 is then heated to bond bonding agent 14 to conductive bump 26. Preassembly 38 is preferably heated to a temperature between about 183° and 280° C. As an example of a preferred heating schedule, preassembly 38 is heated to about 183° C. for about 90 seconds, then the temperature is raised to about 225° C. and is then followed by a soak period of about four minutes at about 170° C. During this process, bonding agent 14 is bonded to metal contact 24. In this manner, a reliable connection between conductive bump 26 and metal contact 24 is formed. The heating step also finishes the curing of film 18 to form thermoset layer 40, as shown in FIG. 5. Thermoset layer 40 is effective to bond integrated circuit component 20 to substrate 12 to form an integral microelectronic assembly 10. Gap 28 is effective to receive portions 44 of film 18 that are perforated by tips 34 of conductive bumps 26.

The product assembly thus comprises an integrated circuit component mounted to a substrate. A bonding agent physically and electrically connects conductive bumps on the component with a metal contact on the substrate. The bonding agent is disposed within a via in the substrate and connects the conductive bumps to the metal contacts during a heating step, which also serves to cure a polymeric layer that is interposed between the integrated circuit component and the substrate. By placing the prepolymer prior to superposing the integrated circuit component, the need to underfill the component with a liquid precursor has been eliminated.

Thus, the present invention provides a method for forming a microelectronic assembly. A bonding agent, such as a solder paste, is dispensed into vias in a substrate. A partially-cured film is disposed on the substrate and covers and is spaced apart from the bonding agent in the vias by a gap. An integrated circuit component is then superposed onto the substrate such that conductive bumps on the integrated circuit component perforate the film and contact the bonding agent to form a preassembly. Portions of the film perforated by the conductive bumps are received in the gap. The preassembly is then heated to concurrently finish the curing of the film to form an underfilling thermoset layer interposed between the substrate and the integrated circuit component. The heating bonds the bonding agent to the conductive bumps and the metal contact to form an integral microelectronic assembly.

By placing a film onto the substrate and superposing an integrated circuit component onto it, reliable and complete underfilling of the integrated circuit component is achieved. Further, the time necessary to underfill the component by dispensing a prepolymer adjacent the component and drawing the prepolymer in via capillary action is eliminated, thereby shortening the time required to form a microelectronic assembly. In addition, the gap in the via allows portions of the film perforated to be received. This decreases the resistance to the perforation such that the bumps reliably penetrate the film.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A method for forming a microelectronic assembly, the method comprising:

fabricating a substrate that includes a via having a predetermined volume;

dispensing a bonding agent into the via in an amount less than the predetermined volume, thereby forming a partially filled via;

applying a film onto the substrate, said film covering the partially filled via; and superposing an integrated circuit component comprising a conductive bump onto the substrate to form a preassembly, said superposing including perforating the film by the conductive bump such that the conductive bump extends into the partially filled via into contact with the bonding agent and the partially filed via provides clearance for portions of the film displaced during perforation.

2. A method for forming a microelectronic assembly in accordance with claim 1, wherein the film is formed of a thermoset prepolymer, and wherein the method further comprises the step of heating the preassembly to bond the bonding agent to the conductive bump and to concurrently cure the thermoset prepolymer to form a polymeric layer interposed between the integrated circuit component and the substrate.

3. A method for forming a microelectronic assembly in accordance with claim 2, wherein the step of heating is carried out at a temperature between about 183° and 280° C.

4. A method for forming a microelectronic assembly in accordance with claim 1, wherein the bonding agent comprises solder particles dispersed in a liquid vehicle.

5. A method for forming a microelectronic assembly in accordance with claim 1, wherein the bonding agent comprises a metal particulate-filled prepolymeric material curable to form a conductive resin bond.

6. A method for forming a microelectronic assembly, the method comprising:

fabricating a substrate that includes a via having an opening, and a contact adjacent the via remote from the opening;

dispensing a bonding agent into the via through the opening to partially fill the via;

applying a film onto the substrate, the film formed of a thermoset prepolymer that is curable to form a thermoset resin and covers the via and is spaced apart from the bonding agent by a gap;

superposing an integrated circuit component comprising a conductive bump onto the substrate to form a preassembly such that the conductive bump perforates the film and extends into the partially filled via, said gap providing clearance for material of the film displaced during perforation; and heating the preassembly to bond the bonding agent to the conductive bump and to concurrently cure the film.

7. A method for forming a microelectronic assembly in accordance with claim 6, wherein the step of heating the preassembly bonds the film to the integrated circuit component and to the substrate to form an integral assembly.

8. A method for forming a microelectronic assembly in accordance with claim 6, wherein the step of heating the preassembly comprises heating the preassembly to a temperature between about 183° and 280° C.

9. A method for forming a microelectronic assembly in accordance with claim 6, wherein the step of dispensing a bonding agent comprises screen printing the bonding agent into the via.

10. A method for forming a microelectronic assembly in accordance with claim 6, wherein the step of dispensing a bonding agent comprises syringe dispensing.

11. A method for forming a microelectronic assembly in accordance with claim 6, wherein the bonding agent comprises solder particles dispersed in a liquid vehicle.

12. A method for forming a microelectronic assembly in accordance with claim 6, wherein the bonding agent comprises a metal particulate-filled prepolymeric material curable to form a conductive resin body.

13. A method for forming a microelectronic assembly, the method comprising:

fabricating a flexible substrate comprising a top face, a bottom face opposite the top face, a via having a predetermined volume and an opening at the top face, and a metallic bond pad closing the via at the bottom face;

dispensing a solder paste into the via through the opening in an amount less than the predetermined volume to form a partially filed via, the solder paste comprising solder particles dispersed in a liquid vehicle;

applying a film to the top face, the film formed of a prepolymer that is thermally curable to form an epoxy resin, the film covering the partially filled via and spaced apart from the solder paste by a gap;

superposing an integrated circuit die onto the flexible substrate to form a preassembly comprising the film interposed between the flexible substrate and the integrated circuit die, the integrated circuit die comprising a conductive bump and being superposed such that the conductive bump perforates the film, thereby forming a portion about the body that extends into the partially filled via into contact with the solder paste, the gap providing clearance for the portion;

heating the preassembly to coalesce the solder particles into a molten body and to concurrently cure the film and bond the film to the integrated circuit die and to the flexible substrate to form an integral microelectronic assembly; and cooling to solidify the molten body to bond the solder bump to the metallic bond pad.

14. A method for forming a microelectronic assembly in accordance with claim 13, wherein the step of heating comprises heating the preassembly to a temperature between about 183° and 225° C.

15. A method for forming a microelectronic assembly in accordance with claim 13, wherein the epoxy resin bonds the integrated circuit die and the flexible substrate into an integral assembly.

16. A method for forming a microelectronic assembly, the method comprising:

fabricating a flexible substrate comprising a top face, a bottom face opposite the top face, a via having an opening at the top face, and a metallic bond pad closing the via at the bottom face;

dispensing a prepolymeric material into the via through the opening to form a partially filled via, the prepolymeric material comprising metal particulate dispersed in a conductive resin body;

applying a film to the top face, the film formed of a prepolymer that is thermally curable to form an epoxy resin, the film covering the partially filled via and spaced apart from the solder paste by a gap;

superposing an integrated circuit die onto the flexible substrate to form a preassembly comprising the film interposed between the flexible substrate and the integrated circuit die, the integrated circuit die comprising a conductive bump and being superposed such that the conductive bump perforates the film, thereby forming a portion about the body that extends into the partially filled via into contact with the solder paste, the gap providing clearance for the portion; and heating the preassembly to cure the prepolymeric material and to concurrently cure the film and bond the film to the integrated circuit die to the flexible substrate to form an integral microelectronic assembly.

17. A method for forming a microelectronic assembly in accordance with claim 16 herein the step of heating comprises heating the preassembly to a temperature between about 183° and 225° C.

18. A method for forming a microelectronic assembly in accordance with claim 16, wherein the epoxy resin bonds the integrated circuit die and the flexible substrate into an integral assembly.

* * * * *